United States Patent [19]

Rossi

[11] Patent Number: 5,600,252
[45] Date of Patent: Feb. 4, 1997

[54] DEVICE FOR INJECTING CURRENT AT RADIO FREQUENCY INTO ELECTRIC WIRING

[75] Inventor: Giuseppe Rossi, Turin, Italy

[73] Assignee: Centro Ricerche Fiat Societa Consortile per Azioni, Strada Torino, Italy

[21] Appl. No.: 353,711

[22] Filed: Dec. 12, 1994

[30] Foreign Application Priority Data

Dec. 23, 1993 [IT] Italy ................ TO93A0994

[51] Int. Cl.$^6$ ................ G01R 27/28
[52] U.S. Cl. ................ 324/635; 324/627; 324/632; 343/703
[58] Field of Search ................ 324/627, 628, 324/632, 635; 343/703; 333/81 A, 81 R

[56] References Cited

U.S. PATENT DOCUMENTS

| | | | |
|---|---|---|---|
| 4,201,987 | 5/1980 | Tricoloes et al. | 343/703 |
| 4,837,581 | 6/1989 | Hansen et al. | 343/703 |
| 4,962,384 | 10/1990 | Walker | 343/703 |
| 5,039,949 | 8/1991 | Hemming et al. | 343/703 |
| 5,053,712 | 10/1991 | Hansen | 324/627 |
| 5,237,283 | 8/1993 | Carbonini | 324/632 |
| 5,285,164 | 2/1994 | Wong | 324/627 |
| 5,369,367 | 11/1994 | Eisenhart | 324/632 |
| 5,430,456 | 7/1995 | Osburn | 343/703 |
| 5,440,316 | 8/1995 | Podgorski et al. | 343/703 |

OTHER PUBLICATIONS

"New Standards Specify Data Line Tests", *Test & Measurement World Communications Test Supplement*, May 1991, San Francisco, CA.

"Field Strength Distribution in the Interior of GTEM Cells", *Electronic Engineering*, vol. 64, No. 784, Apr. 1992, Woolwich, London GB.

European Search Report for Italian Application No. ITATO930994, dated 25 Oct. 1994, citing the above-noted references.

*Primary Examiner*—Maura K. Regan
*Attorney, Agent, or Firm*—Merchant, Gould, Smith, Edell, Welter & Schmidt, P.A.

[57] ABSTRACT

A device for injecting current at radio frequency into electric wiring, comprises a guiding structure (10) of an electrically conductive material consisting of a tapered shell (12) wherein a central vertical wall (20) is suspended determining two half-spaces (S, D) within the shell (12). At the tapered end, the shell (12) and the central vertical wall (20) are respectively connected to the braiding and the central wire of a coaxial cable (17) supplying radio frequency electric current. At the end opposite to said tapered end, a wiring (19) is disposed through the structure (10) perpendicular to the vertical central wall (20) and rests on a base (11) of dissipating material. In one of the two half-spaces, the wiring (19) is protected by a shield (23) integral with the shell (12).

8 Claims, 2 Drawing Sheets

DEVICE FOR INJECTING CURRENT AT RADIO FREQUENCY INTO ELECTRIC WIRING

BACKGROUND OF THE INVENTION

The present invention relates to a device for injecting current at radio frequency into electric wiring.

Radio frequency current injection in wiring is typically carried out for evaluating electromagnetic susceptibility of electronic devices connected to electric wiring and electromagnetic compatibility with the environment of electronic systems consisting of wiring and electronic devices. Electronic systems are subject to bad functioning due to electromagnetic fields in their working environment. This is the case that may occur with an electronic system installed on a vehicle passing near electromagnetic sources, for example radio transmitters.

In order to test susceptibility of electronic processing units in electromagnetic fields, at present the wiring and relevant processing units are tested in shielded anechoic chambers, wherein high intensity electromagnetic fields are created. The results obtained by this method are most satisfactory, but there is an economic drawback in that such anechoic chambers are extremely expensive.

Therefore, an effort has been made in trying to get around the problem by constructing devices for carrying out electromagnetic susceptibility tests without using anechoic chambers. These devices are positioned on sheaves of cables and radio frequency electric currents are injected into them, so as to simulate interference of electromagnetic fields on electronic systems.

At present, available devices of the above kind have exhibited low operational efficiency with frequencies over 500 MHz. In other cases, said devices are considerably cumbersome and are not suitable for use on a short wiring or within a limited space.

SUMMARY OF THE INVENTION

It is an object of this invention to provide a device which is capable of resolving the above cited prior art problems and injecting in wiring a current intensity which can clearly give a warning of possible problems of electromagnetic incompatibility for the electronic systems.

It is another object of the invention to provide a device having reduced overall dimensions, adapted for application with cables having any length or located in positions difficult to reach. Last but not least, it is a further object of this invention to provide a device which is inexpensive to construct and use.

The working principle which the device of this invention is based on is the generation of an electromagnetic field within a guiding structure. The wiring in which radio frequency current is to be injected is slipped through said structure. The structure is shaped and arranged so as to create therein an electric field having a given direction. By laying the wiring inside the structure so as to align it parallel with respect to the lines of force of the electric field, radio frequency currents are injected in the wiring.

The above and further objects and advantages are attained according to the invention by a device for injecting current at radio frequency into electric wiring, characterised in that it comprises a guiding structure of an electrically conductive material consisting of a tapered shell wherein a central vertical wall is suspended determining two half-spaces within the shell; at the tapered end, the shell and the central vertical wall being respectively connected to the braiding and the central wire of a coaxial cable supplying radio frequency electric current; at the end opposite to said tapered end, a wiring being disposed through the structure perpendicular to said vertical central wall and resting on a base of dissipating material; in one of the two half-spaces, said wiring being protected by a shield integral with the shell.

BRIEF DESCRIPTION OF THE DRAWINGS

The structural and operational characteristics of a preferred but not-limiting embodiment of a device according to the invention are described hereinafter with reference to the accompanying drawings, in which.

DESCRIPTION OF THE PREFERRED EMBODIMENT

Figure 1:
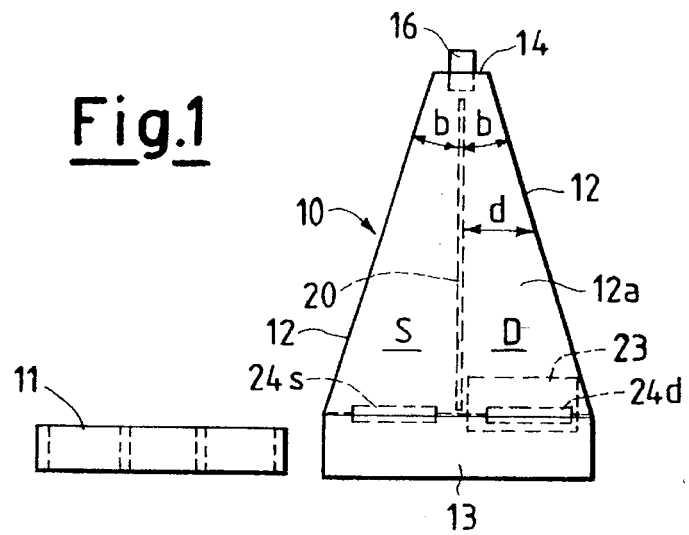
FIGS. 1, 2, 3 are respectively a side, front and top view of the two components of the device of this invention.
Figure 2:
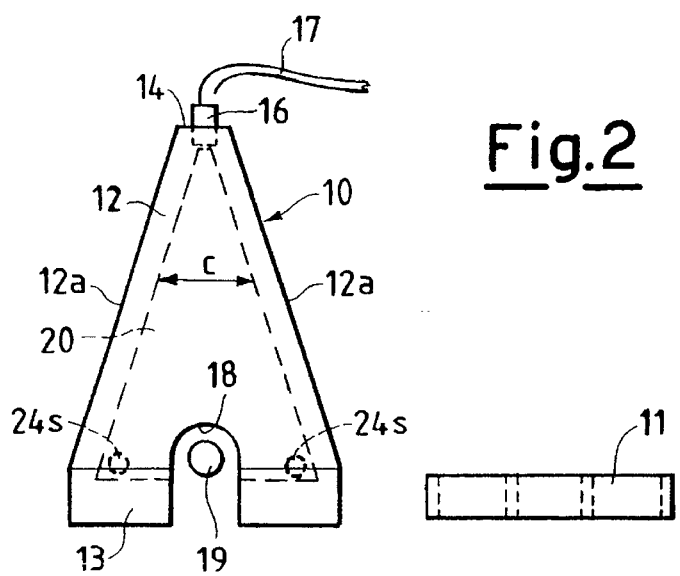
Figure 3:
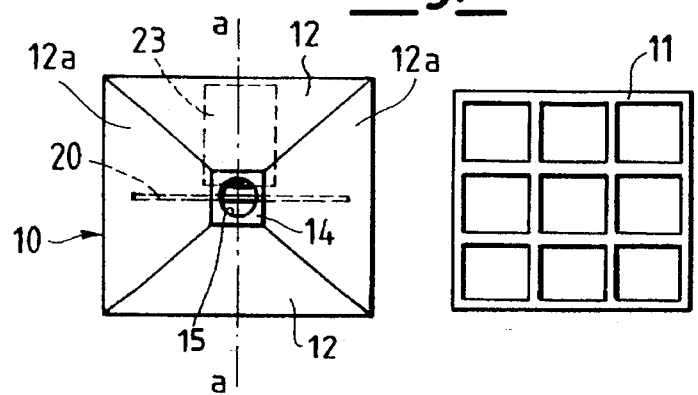

With reference initially to FIGS. 1 to 3, a device according to the invention for injecting current at radio frequency into electric wiring is basically composed by two distinct components: a guiding structure 10 and a base 11 for supporting a wiring, as will be more apparent hereinafter.

The guiding structure 10 is made of an electrically conductive material, for example copper, and comprises an outer shell 12 truncated cone in shape and having a substantially square plan. Shell 12 is upwardly tapered and has a lower vertical edge 13. As shown in FIG. 3, a small horizontal square base 14 is located at the top of structure 10. In the centre of base 14 a circular opening 15 is obtained for accommodating a connector 16 providing electrical connection to a radio frequency power generator through a coaxial cable 17. The radio frequency power generator is not shown nor described as it is already known to those skilled in the art.

Starting from the base of edge 13, two opposite doors are obtained on two opposite sides of structure 10. Doors 18 are for allowing the passage of a wiring 19 through the larger lower portion of truncated-cone shell 12. The wiring is oriented parallel to the line of intersection of the other two faces 12a of the pyramid where no door is provided. The guiding structure 10 comprises a central vertical wall 20 dividing in two equal parts the space within the truncated-cone shell 12, determining two zones or half-spaces S and D. Wall 20 has a substantially triangular shape and its bottom ends level to the edge 13 without contacting the outer walls 12 of the pyramid. Spacers (not shown) of insulating material can eventually be inserted between walls 12 and central vertical wall 20. In the example shown in the drawings, wall 20 is suspended within shell 12 by means of connector 16, and does not contact the outer walls in any way.

Aligned with doors 18 is a semicircular recess 22 obtained in the middle of lower side of wall 21. A semicylindrical shield 23 having its concavity directed downwardly is located in half-space D axially aligned doors 18 and recess 22. Shield 23 extends from door 18 of half-space D towards wall 20 and ends near the latter without contacting it.

The central wire of coaxial cable 17 is connected to central wall 20. The braiding is connected to outer shell 12.

Figure 4:
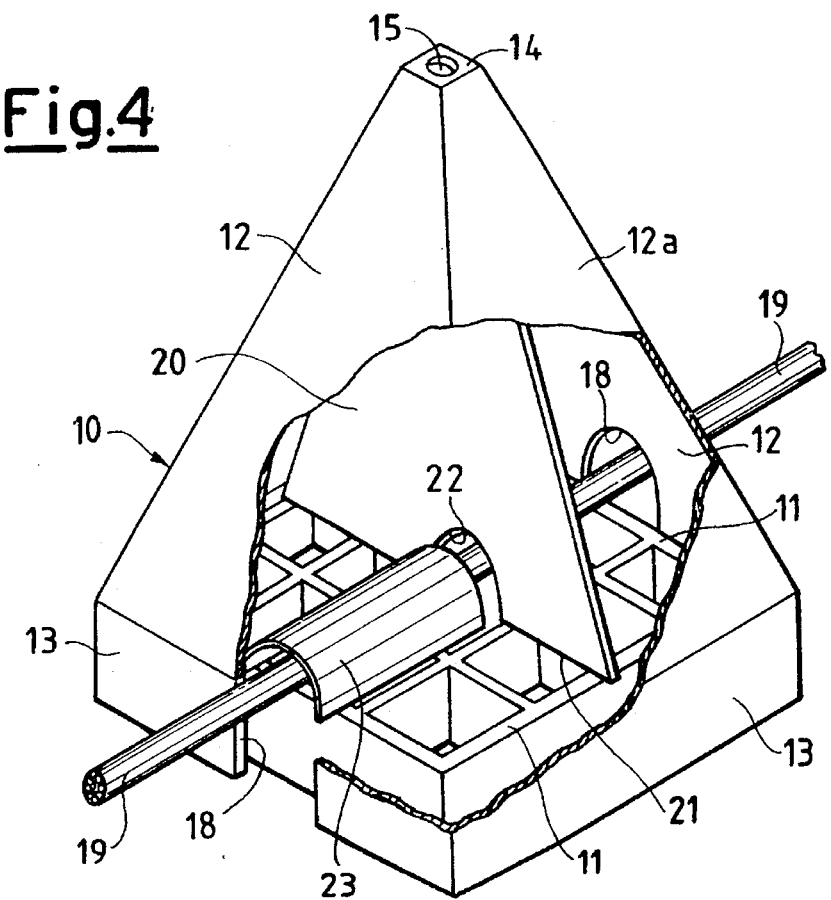
FIG. 4 is a perspective view with broken off parts of the device once assembled.

According to a preferred embodiment of the present invention, in order to increase efficiency of guiding structure 10, this is provided with terminal resistors connecting the central wall to the shell in the lower part of the device. As shown in FIGS. 1, 2 and 4, two pairs of terminal resistors 24s, 24d, are disposed horizontal and parallel to axis "a" of doors 18 in the lower part of half-spaces D and S, slightly above edge 13. In each half-space, the resistors are spaced apart and located proximate to side walls 12a and edge 13. Each resistor is aligned with the corresponding resistor fitted in the opposite half-space.

The wiring supporting base 11 is a substantially square-module grid, the sides of which are congruent with the inside of edge 13, so that the base can fit within and under the guiding structure 10. Preferably, base 11 is made of a dissipating material such as ferrite, capable of absorbing radio frequency energy.

The particular tapered shape of the device according to this invention, that from an electromagnetic point of view is the continuation of coaxial power supply cable 17, has the purpose of maintaining the impedance value of cable 17 constant throughout the whole height of the device. Therefore, the outer walls 12a are suitably inclined so that each forms an angle "b" with the central wall 20 and in any point the c-to-d ratio is constant, wherein "c" is the width of central wall 20 and "d" is the distance between the central wall and the side wall. Said constant value determines an impedance constant for the structure 10, equal to the characteristic impedance of cable 17. The ferrite base 11 maintains this constant value also in the lowest part of the device.

For testing, the wiring 19 is laid down in the middle of base 11 along axis "a". Then, base 11 is covered by positioning guiding structure 10 on top of it so that the wiring passes through doors 18 and recess 22 while being covered by shield 23 in half-space D.

Radio frequency power is then supplied to structure 10 through cable 17 and connector 16, thereby creating within the structure an electric field having lines of force parallel to wiring 19. In this way, radio frequency current is injected in wiring 19 by electromagnetic induction.

During the test, the features of wiring 19 are studied by altering the frequency of the power transmitted to structure 10 and consequently the current injected in the wiring, simulating various electromagnetic disturbance and noise conditions that could compromise or not correct operation of the electronic processing unit connected to the wiring.

Protection shield 23 is of basic importance as it prevents injection of equal and opposite currents in both portions of the wiring located in half-spaces S and D. The ferrite base 11 prevents the magnetic field within the device from propagating outside.

Figure 5:
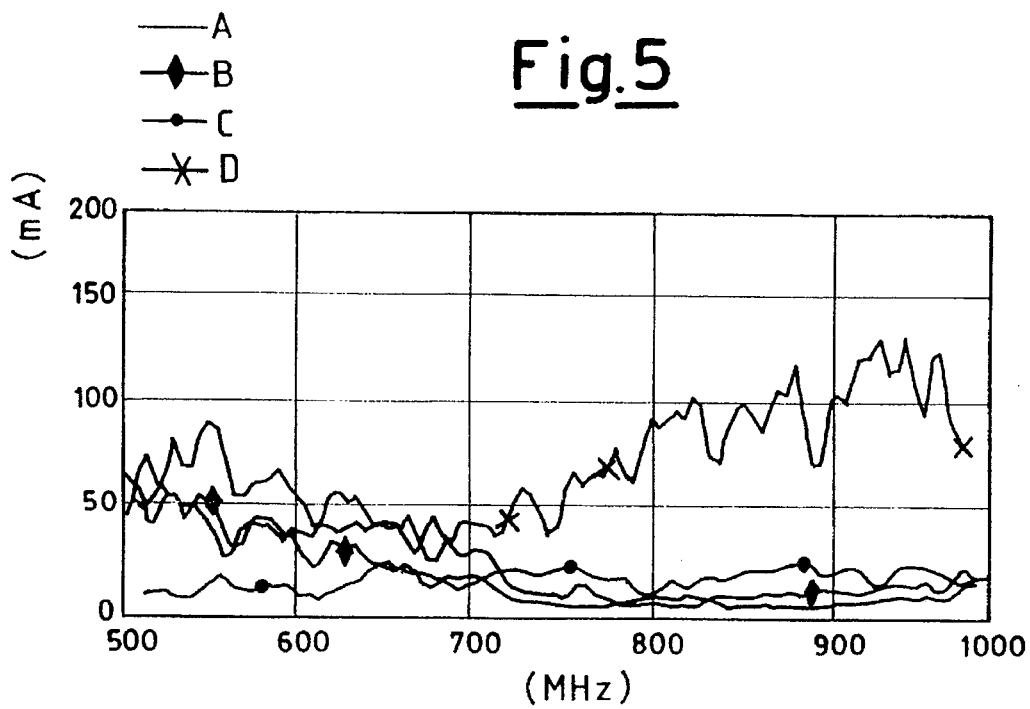
FIG. 5 reports several graphs showing current intensities taken experimentally at different frequencies in a wiring by means of several devices, among which the one of this invention.

Referring to FIG. 5, as will be apparent by comparing the graphs obtained by injecting current in a wiring, the device according to the present invention generates currents having an intensity clearly higher than those obtainable by means of conventional devices. Consequently, the device of this invention provides a signal having equal intensity using up considerably less power. In addition, the results given by such a device are much more reliable.

In FIG. 5, the various graphs report injected current intensity at different frequencies using the following devices:

(A) Chase probe (current transformer);
(B) Eaton probe (current transformer);
(C) Musorb probe (TEM cell);
(D) device of this invention.

I claim:

1. A device for injecting current at radio frequency into electric wiring, characterised in that it comprises a guiding structure (10) of an electrically conductive material consisting of a tapered shell (12) wherein a central vertical wall (20) is suspended determining two half-spaces (S, D) within the shell (12); at the tapered end, the shell (12) and the central vertical wall (20) being respectively connected to the braiding and the central wire of a coaxial cable (17) supplying radio frequency electric current; at the end opposite to said tapered end, a wiring (19) being disposed through the structure (10) perpendicular to said vertical central wall (20) and resting on a base (11) of dissipating material; in one (D) of the two half-spaces, said wiring (19) being protected by a shield (23) integral with the shell (12).

2. A device according to claim 1, characterised in that the shell (12) has a substantially truncated pyramid shape with a square plan, adapted for accommodating at the top thereof a connector (16) providing electric connection to the coaxial cable (17).

3. A device according to claim 1, characterised in that the wiring supporting base (11) is a substantially square grid, the sides of which are congruent with the inside of the shell (12), so as to fit within and under the guiding structure (10).

4. A device according to claim 1, characterised in that the base (11) is made of ferrite.

5. A device according to claim 1, characterised in that each wall (12a) of the shell facing the central wall (20) forms an angle (b) therewith, whereby throughout the device the (c)-to-(d) ratio is constant, wherein (c) is the width of said central wall (20) and (d) is the distance between said central wall (20) and the side wall (12a), said ratio determining an impedance constant value for the structure (10), equal to the characteristic impedance of said cable (17).

6. A device according to claim 1, characterised in that the structure (10) is provided with terminal resistors (24) located proximate to the base (11).

7. A device according to claim 6, characterised in that two pairs of terminal resistors (24s, 24d) are disposed horizontal and parallel to the wiring (19) in the lower zone of half-spaces (S, D); in each half-space, the resistors being spaced apart and located proximate to the side walls (12a); each resistor being aligned with the corresponding resistor (24d, 24s) fitted in the opposite half-space (S, D).

8. A device according to claim 2, characterised in that the central vertical wall (20) is suspended within the shell (12) by said connector (16).

* * * * *

UNITED STATES PATENT AND TRADEMARK OFFICE
CERTIFICATE OF CORRECTION

PATENT NO. : 5,600,252

DATED : Feb. 4, 1997

INVENTOR(S) : Rossi

It is certified that error appears in the above-indentified patent and that said Letters Patent is hereby corrected as shown below:

On the title page, item [75], "Turin" should read --Torino--.

On the title page, item [57] Abstract should read --A device for injecting current at radio frequency into electrical wiring has a guiding structure of an electrical conductive material. The guiding structure has a shell with a tapered end and a vertical wall suspended to form two half-spaces within the shell. At the tapered end of the shell, the shell and the vertical wall are respectively connected to the braiding and the central wire of the coaxial cable supplying radio frequency electrical current. At the end opposite the tapered end, wiring is disposed through the structure perpendicular to the vertical wall and rests on a base of dissipating material. In one of the two half-spaces, the wiring is protected by a shield integral with the shell.--

Signed and Sealed this

Twenty-eighth Day of October, 1997

*Attest:*

BRUCE LEHMAN

*Attesting Officer*     *Commissioner of Patents and Trademarks*